United States Patent [19]

Makino et al.

[11] Patent Number: 5,053,311

[45] Date of Patent: Oct. 1, 1991

[54] DIRECT PLANOGRAPHIC PRINTING PLATE REQUIRING NO DAMPENING

[76] Inventors: Fumikatsu Makino, 1-15, Enoki-cho, Tokorozawa-shi, Saitama-ken; Yoichi Shimokawa, 15-28, Nakanosho 2-chome, Ootsu-shi, Shiga-ken, both of Japan

[21] Appl. No.: 647,868

[22] Filed: Sep. 5, 1984

Related U.S. Application Data

[63] Continuation of Ser. No. 494,684, May 17, 1983, abandoned, which is a continuation of Ser. No. 282,588, Jul. 13, 1981, abandoned.

[30] Foreign Application Priority Data

Jul. 14, 1980 [JP] Japan ............................. 55-94979
Jul. 17, 1980 [JP] Japan ............................. 55-97755

[51] Int. Cl.$^5$ .................. G03F 7/023; G03F 7/075; B41N 1/14
[52] U.S. Cl. ................. 430/166; 430/162; 430/272; 430/303; 101/453
[58] Field of Search ............. 101/453; 430/166, 162, 430/272, 303

[56] References Cited

U.S. PATENT DOCUMENTS

| 1,669,416 | 5/1928 | Huebner | 101/401.1 |
|---|---|---|---|
| 2,752,280 | 6/1956 | Cooke | 428/909 |
| 3,677,178 | 7/1972 | Gipe | 101/450 |
| 3,859,090 | 1/1975 | Yoerger | 101/457 |
| 3,881,045 | 4/1975 | Strunk | 428/250 |
| 3,894,873 | 7/1975 | Kobayashi | 430/303 |
| 3,945,830 | 3/1976 | Yazawa | 101/465 |
| 3,953,212 | 4/1976 | Miyano | 101/456 |
| 4,015,046 | 3/1977 | Pinkston | 428/909 |
| 4,086,093 | 4/1978 | Ezumi | 430/281 |
| 4,112,841 | 9/1978 | Deshponde | 101/401.1 |
| 4,259,905 | 4/1981 | Abiko | 430/303 |

FOREIGN PATENT DOCUMENTS

| 659924 | 10/1951 | United Kingdom | 101/379 |
|---|---|---|---|
| 2059874 | 4/1981 | United Kingdom | 430/303 |

*Primary Examiner*—Clifford D. Crowder

[57] ABSTRACT

A planographic printing plate suitable for direct printing, which comprises a support comprised of a rubber layer, a photosensitive resin layer laminated on the support and a silicone rubber layer laminated on the photosensitive resin layer. Preferably, a barrier layer is formed between the support and the photosensitive resin layer.

3 Claims, No Drawings

DIRECT PLANOGRAPHIC PRINTING PLATE REQUIRING NO DAMPENING

This application is a continuation of application Ser. No. 494,684, filed May 17, 1983 which is a continuation of application Ser. No. 282,588, filed July 13, 1981, both now abandoned.

BACKGROUND OF THE INVENTION (1) Field of the Invention

This invention relates to a planographic printing plate which is suitable for use in direct printing on a material to be printed.

(2) Description of the Prior Art

Printing plates may be classified into two categories, that is, those (first category) which are suitable for use in direct printing wherein an image is transferred from the printing plates directly onto the material to be printed, and those (second category) which are suitable for use in indirect printing wherein an image is transferred from the printing plates through an intermediate carrier onto the material to be printed. The indirect printing of the second category is usually called offset printing. The direct printing of the first category includes typically letterpress printing and gravure printing. However, offset printing can be effected by using letterpress printing plates and direct printing can be effected by using lithographic printing plates.

Newspaper printing has heretofore been conducted mainly by letterpress printing. However, lithographic offset printing and lithographic direct printing are now attracting people's attention for newspaper printing.

Conventional lithographic printing plates have some problems when they are used for direct printing. This is because dampening water is used in order to maintain the non-image area ink-repellent. For example, in the case where paper is used as the material to be printed, a relatively large amount of dampening water is absorbed by the paper when the paper is brought into direct contact with the printing surface of the printing plate. Consequently, the proportion of the dampening water to the printing ink becomes unbalanced, and the paper is subject to dimensional change and the rolled paper is liable to break. Even where the paper used is non-water-absorptive, the dampening water on the printing plate causes some problems. In the direct printing process, a larger amount of the ink on the image area of the printing plate is transferred onto the material to be printed as compared with the offset printing process. However, in conventional lithographic printing plates, it is difficult to maintain the proportion of dampening water to printing ink at the desired value. Furthermore, it is difficult to control the thickness of the layer of printing ink on the printed material or to increase the thickness of the ink layer to a depth such as in screen printing or gravure printing.

In planographic offset printing, a rubber blanket, which receives printing ink from the printing plate and transfers it onto the material to be printed, ensures uniform printing. In contrast, in direct planographic printing wherein a printing ink is directly transferred from the printing plate onto the material to be printed, it is difficult to apply a completely uniform printing pressure over the entire material to be printed. When the material to be printed has a rough surface including fine convexities and concavities such as those formed by fibers of paper, the ink is preferentially transferred onto the convexities present on the surface of the material to be printed. As means for eliminating this defect, Japanese Patent Publication No. 9323/76 and U.S. Pat. Nos. 4,112,841 and No. 4,114,535 proposed planographic printing plates for direct printing, which comprise a printing layer formed on a rubber elastic layer. In these planographic printing plates, the rubber layer formed below the printing layer acts as a blanket used in offset printing, and this rubber layer ensures good transfer of an ink. However, dampening water must be used and, therefore, these printing plates still have the above-mentioned defects of the conventional dampening planographic printing plates. Furthermore, these printing plates cannot accept a large amount of a printing ink thereon.

SUMMARY OF THE INVENTION

It is an object of the present invention to provide a planographic printing plate which can accept a larger amount of ink thereon than conventional planographic printing plates and can form a print of the desired ink thickness on a material to be printed.

Another object of the present invention is to provide a planographic printing plate which does not need dampening water when used for printing and, therefore, which does not possess the defects of the conventional dampening planographic printing. When the planographic printing plate of the invention is used, there is no need to consider the ratio of dampening water to printing ink, and sharp images of a uniform density can be obtained.

Still another object of the present invention is to provide a planographic printing plate which has photosensitivity and printing characteristics, the variation of which is minimized even with the lapse of time.

Other objects and advantages of the present invention will be apparent from the following description.

In accordance with a fundamental aspect of the present invention, there is provided a planographic printing plate suitable for direct printing, which comprises a support comprising a rubber layer, a photosensitive resin layer laminated on said support and a silicone rubber layer laminated on said photosensitive resin layer.

The photosensitive resin layer preferably contains a photosensitive high polymeric substance as the photosensitive ingredient. Furthermore, a barrier layer is preferably formed between the support and the photosensitive resin layer, which barrier layer is advantageous especially when the photosensitive resin layer contains a low molecular weight compound as the photosensitive ingredient.

DETAILED DESCRIPTION OF THE PREFERRED EMBODIMENTS

The photosensitive resin layer is comprised of a composition containing a photosensitive material. As the photosensitive material there can be mentioned for example those which are disclosed in U.S. Pat. Nos. 3,511,178; No. 3,677,178; No. 3,894,873; and No. 4,086,093; and British Patent No. 1,444,381. Particularly, high polymeric substances, which have a molecular weight of at least 1,000 and are insolubilized or solubilized under irradiation with actinic rays, are preferably used in the present invention. Examples of such photosensitive high polymeric substances will now be described.

(1) Photosensitive high polymeric substances which are photo-insolubilized:

As substances of this type, there can be mentioned photosensitive polymers obtained by making photosensitive groups pendant on a polymer, and modification products of these polymers.

As the photosensitive group, there can be mentioned, for example, an olefinic group, an acryloyl group, a methacryloyl group, a cinnamoyl group, a cinnamylideneacetyl group, a phenylazido group, a diazo group and an α-phenylmaleimido group. Among these groups, there are preferably used an acryloyl group, a methacryloyl group, a cinnamoyl group, a cinnamylideneacetyl group and a phenylazido group in the present invention. As typical instances of the photosensitive polymer preferably used in the present invention, there can be mentioned an azidophthalic acid ester of polyvinyl alcohol and a β(4-azidophenol)tthanol ester of a styrene/maleic anhydride copolymer.

Furthermore, a so-called diazo resin which is a condensate of a diazo type amine such as p-diazophenylamine or p-diazomonoethylaniline with formaldehyde can be used in the present invention.

(2) Photosensitive high polymeric substances to be photo-solubilized:

As the polymeric substance to be photo-solubilized, there can be mentioned complexes of diazo compounds with inorganic acids or organic acids, and products obtained by binding quinone-diazides with appropriate polymeric binders. In the present invention, products obtained by binding quinone-diazides with appropriate polymeric binders are preferably used. A most preferable quinone-diazide photosensitizer combined with a binder is a naphthoquinone-1,2--diazido-5-sulfonic acid ester of a novolak resin with esterification of not less than 35%, preferably from 35% to 65%. The term "novolak resin" herein referred to represents a novolak type phenolic resin prepared by condensing a phenol or m-cresol with formaldehyde. This photosensitizer-containing layer has a satisfactory film-forming properties and good thermal stability.

In combination with the above-mentioned photosensitive high polymeric substance, a small amount of a non-photosensitive high polymeric substance may be used for the photosensitive resin layer in the present invention, and this embodiment is advantageous from a practical viewpoint. If desired, suitable additives such as a photosensitizer, a colorant (such as a dye) and a plasticizer may be used in combination with the photosensitive resin.

The thickness of the photosensitive resin layer is ordinarily in the range of from 0.5 to 30 microns, though this thickness range is not particularly critical. The rubber support layer should preferably possess a Shore A hardness of not more than 90 or a Shore D hardness of not more than 40. As the material of the rubber support layer used in the present invention, there can be mentioned natural rubbers and synthetic rubbers such as polyisoprene rubber, polybutadiene rubber, styrene/butadiene rubber, nitrile rubber, chloroprene rubber, acrylic rubber, butyl rubber, epichlorohydrin rubber, urethane rubber, ethylene/propylene copolymer rubber, styrene/butadiene block copolymer rubber and polyester elastomer. Of these rubbers, nitrile rubber, chloroprene rubber, acrylic rubber, urethane rubber and a polyester elastomer are preferable because they possess good oil resistance.

The thickness of the rubber layer may be varied depending upon the hardness of the rubber used. When rubber of a low hardness is used, the thickness of the rubber layer may be thin. In general, the thickness of the rubber layer is in the range of from about 0.01 to about 1 mm.

In order to impart the form-retaining properties required for a printing plate to the rubber layer, a metal plate such as an aluminum plate or iron plate or a plastic film or the like may be laminated on the surface of the rubber layer opposite to the printing surface.

In the present invention, it is preferred that the thickness of the silicone rubber layer that is used as an ink-repellent layer be in the range of from 1 to 100 microns, more preferably from 1 to 50 microns. If the thickness of the silicone rubber layer is too small, the printing resistance of the printing plate is often insufficient. In contrast, if the thickness of this layer is too large, removal of the silicone rubber layer at the development step becomes difficult and the image reproducibility is reduced. A room temperature vulcanization type (RTV type) silicone rubber is preferred because it is promptly cured even at low temperatures. This silicone rubber is obtained by sparsely crosslinking a linear diorganopolysiloxane as the base polymer. The degree of crosslinking can be expressed by the R/Si ratio in the silicone rubber recurring units represented by the following structural formula:

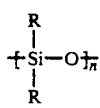

wherein n is an integer of at least 2, and R stands for an alkyl group having 1 to 10 carbon atoms, a halogenoalkyl group having 1 to 10 carbon atoms, a vinyl group, an aryl group or a cyanoalkyl group having 1 to 10 carbon atoms, and wherein it is preferred that at least 60% of groups R be methyl groups and it is most preferred that all of groups R be methyl groups, that is, the polymer be dimethylpolysiloxane. A silicone rubber that is used effectively in the present invention has an R/Si ratio of from 1.95 to 2.10, preferably from 1.99 to 2.01. Such silicone rubber is obtained by condensing a silicone base polymer having recurring units expressed by the above structural formula with a silicone-crosslinking agent selected from (1) R—Si(OR)$_3$, (2) R—Si—(OAc)$_3$ and (3) R—S si(ON=CR'$_2$)$_3$ in which R is as defined above, R' stands for an alkyl group such as a methyl or ethyl group, and Ac stands for an acetyl group.

In this crosslinking reaction, a carboxylic acid salt containing a metal such as tin, zinc, cobalt or lead, for example, dibutyltin dilaurate, tin octoate or cobalt naphthenate, is added as a catalyst to the above-mentioned components. In order to improve the strength of the silicone rubber and enhance the resistance to friction generated during the printing operation, filler may be incorporated into the silicone rubber.

If necessary, an adhesive layer may be formed between the photosensitive resin layer and the silicone rubber layer to enhance the adhesion between these two layers. An adhesive layer may also be formed between the photosensitive resin layer and the rubber support layer and, when a barrier layer is provided, between the barrier layer and the photosensitive resin layer. Various adhesive materials can be used, but, as the adhesive layer formed between the photosensitive resin layer and the silicone rubber layer, an aminosilane layer is especially preferred. By the aminosilane referred to herein is meant a compound represented by the following general formula:

$$R_mR'_nSi(OR'')_{4-m-n}$$

wherein R stands for an alkyl group having an unsubstituted or substituted amino group, R' and R" stand for an alkyl or aryl group, and m is 1 or 2 and n is 0 or 1, with the proviso that the relation of m+n=1 or 2 is established. As such aminosilane, there can be mentioned, for example, γ-aminopropyltriethoxysilane and γ-[N-(2-aminoethyl)amino]propyltrimethoxysilane. The thickness of the adhesive layer is ordinarily in the range of from 10 milli-microns to 0.5 microns.

When the photosensitive resin layer contains a low molecular weight reactive monomer and/or a photosensitizer ingredient, since such low molecular weight substances tend to migrate into the rubber layer, the characteristics of the resulting printing plate are greatly changed with the lapse of time, and the printing plate cannot be put into practical use. This defect is advantageously overcome by forming a barrier layer between the support and the photosensitive resin layer. As the barrier layer, there can be mentioned films of synthetic resins such as polyethylene terephthalate, polypropylene, polyvinyl chloride, polyvinylidene chloride, a vinyl chloride/vinylidene chloride copolymer, polyamide, polyvinyl alcohol and cellulose acetate. The thickness of the barrier layer is ordinarily in the range of from 0.5 to 30 microns. If the thickness of the barrier layer is too small and outside this range, it is difficult to prevent the bariation of photosensitive characteristics with the lapse of time. If the thickness of the barrier layer is too large and outside the above-mentioned range, the rubber elasticity of the rubber layer used as the support fails to exert a sufficient effect on the photosensitive resin layer through the barrier layer. In order to attain the objects of the present invention, a barrier layer having a thickness of 1 to 10 microns is advantageous. Among the above-mentioned synthetic resin films, polyethylene terephthalate and polypropylene films are preferably used. These synthetic resin films have better resistance to chemicals than the rubber support layer and, therefore, they function to protect the rubber support layer.

For formation of such barrier layer between the rubber support layer and the photosensitive resin layer, there may be adopted, for example, a method in which a synthetic resin film is bonded to the support by using an adhesive, a method in which a synthetic resin film is laminated integrally with an unvulcanized rubber layer as the support, followed by vulcanization, a method in which a synthetic resin film is extrusion-laminated on the rubber support layer, and a method in which rubber is dissolved in a solvent and the solution is coated on a synthetic resin film.

When the photosensitive resin layer and silicone rubber layer are formed in sequence by coating on the barrier layer formed on the rubber support layer, there can be obtained a planographic printing plate suitable for direct printing, which has highly improved practical utility.

A protecting film may be laminated on the surface of the silicon rubber layer which is a surface layer of the so-prepared planographic printing plate. A practically valuable protecting film has a transparency allowing transmission of ultraviolet rays and a thickness smaller than 100 microns, preferably smaller than 10 microns. For example, there can be mentioned films of polyethylene, polypropylene, polyvinyl chloride, polyvinylidene chloride, polyvinyl alcohol, polyethylene terephthalate and cellophane.

The planographic printing plate of the present invention is suitable for direct printing on various materials including paper, metals, films, glass, wood, synthetic resins and ceramics. Particularly, the printing plate forms a sharp image even on a hard material. Since the planographic printing plate of the present invention accepts a printing ink in the concave areas and, therefore, a sharp print image can be obtained with high fidelity.

The present invention will now be described in detail with reference to the following Examples that by no means limit the scope of the invention.

EXAMPLE 1

A chloroprene rubber layer having a thickness of 0.3 mm and a rubber hardness of 60 (Shore A) was formed on an aluminum sheet having a thickness of 0.3 mm, and a 10% by weight solution in dioxane of a naphthoquinone-1,2-diazido-5-sulfonic acid ester of a phenolic novolak resin (having a molecular weight of about 1,300 and an esterification degree of 45%) (the novolak resin used was "Sumilite Resin PR 50235"[trademark]manufactured and supplied by Sumitomo Bakelite) was coated on the so-formed composite substrate and was dried in hot air maintained at 60° C. to form a photosensitive resin layer having a thickness of 3 microns. A 0.5% by weight solution of γ-aminopropyltriethoxysilane ("A1100"[trademark]manufactured and supplied by UCC) in n-hexane was coated on the photosensitive resin layer and dried in hot air maintained at 100° C. Then, a 10% by weight solution in n-hexane of a silicone gum compound having a composition described below was coated on the γ-aminopropyltriethoxysilane layer and dried in hot air maintained at 100° C. to form a silicone rubber layer having a thickness of 2 microns.

| | |
|---|---|
| (a) Polydimethylsiloxane (containing OH groups on both the molecule terminals and having a molecular weight of about 80,000) | 100 parts by weight |
| (b) Methyltriacetoxysilane | 5 parts by weight |
| (c) Dibutyl tin diacetate | 0.2 part by weight |

A negative film was superpose don the so-obtained printing plate and caused to adhere closely to the printing (plate under reduced pressure, and the assembly was exposed for 60 seconds to rays from a 2-KW metal halide lamp ("EYEDOLPHIN 2,000" [trademark]manufactured and supplied by Iwasaki Electric Co.) located 1 m from the printing plate. The exposed surface of the printing plate was immersed in ethanol and was lightly rubbed with a cotton pad. The silicone rubber layer was easily removed in the exposed area and the rubber layer was exposed to the surface, while the silicone rubber layer was strongly adhered in the nonexposed area. Thus, an image of the negative film was reproduced on the resulting printing plate with a high fidelity. When a printing plate prepared in this manner was stored for 1 month at room temperature or for 7 days at 50° C before exposure to actinic rays, the photosensitive characteristics were changed only to a negligible extent.

When the printing plate was attached to an ordinary flat bed betterpress printing machine and direct printing was conducted on coated paper by using a waterless planographic printing ink ("ALPO-G" [trademark]manufactured and supplied by Toka Shikiso Kagaku Kogyo), the ink was transferred onto the entire paper in a very good state and prints having a sharp image were obtained.

COMPARATIVE EXAMPLE 1

A printing plate was prepared in the same manner as described in Example 1 except that a 1/1 weight ratio mixture of a phenolic novolak resin and a phenol ester (having a molecular weight of 326) of naphthoquinone-1,2- -diazido-5-sulfonic acid was used for formation of the photosensitive resin layer.

Immediately after the preparation, this printing plate had plate-making and printing characteristics similar to those of printing plate prepared in Example 1, but when a so-prepared printing plate was stored for 1 month at room temperature or for 7 days at 50° C., the image-forming properties deteriorated and an image could not be formed on the plate.

EXAMPLE 2

A printing plate was prepared in the same manner as described in Example 1 except that a photosensitive layer was formed by coating in the following manner.

A 5% by weight solution in methyl cellosolve acetate of polycinnamylideneacetate obtained by esterifying completely saponified polyvinyl alcohol having a degree of polymerization of 1,400 ("Gohsenol NM-14" [trademark]manufactured and supplied by Nihon Gosei Kagaku) with cinnamilydeneacetic acid was coated on the rubber layer and dried in hot air maintained at 80° C. to form a layer having a thickness of 3 microns.

A polyester film having a thickness of 10 microns ("Lumirror" [trademark]manufactured and supplied by Toray Ind. Inc.) was laminated on the topmost silicone rubber layer before light exposure. Then, a positive film was superposed on the polyester film and caused to adhere closely to the polyester film under reduced pressure. Then, the printing plate was exposed for 5 minutes to rays of 2-KW super-high-pressure mercury lamp (manufactured and supplied by OHC Mfg. Co. Ltd.) located 1 m from the printing plate. When the surface of the exposed surface was lightly rubbed with a cotton pad impregnated with trichlene, the silicone rubber layer was easily removed in the non-exposed area, but the silicone rubber layer strongly adhered in the exposed area and an image of the positive film was reproduced on the resulting printing plate with a high fidelity. The direct printing test was carried out by using the so-prepared printing plate in the same manner as described in Example 1. Good results were similarly obtained.

When a printing plate prepared as in this example was stored at room temperature for 1 month or at 50° C. for 7 days before exposure, the photosensitive characteristics were changed only to a negligible extent.

COMPARATIVE EXAMPLE 2

A chloroprene rubber layer having a thickness of 0.3 mm and a rubber hardness of 60 (Shore A) was formed on an aluminum sheet having a thickness of 0.3 mm, and a 10% by weight solution of a solid composition described below in ethyl cellosolve was coated on the so-obtained composite substrate and was dried in hot air maintained at 80° C to form a photosensitive layer having a thickness of 4 microns.

| | | |
|---|---|---|
| (a) | Polyurethane ("Pandex T 5205" [trademark] manufactured and supplied by Dainippon Ink Kagaku Kogyo) | 56 parts by weight |
| (b) | Reaction product (having a molecular weight of 704) of 4 mols of glycidyl methacrylate and 1 mol of xylylene diamine | 40 parts by weight |
| (c) | Michler's ketone (having a molecular weight of 268) | 4 parts by weight |
| (d) | Maleic acid | 0.5 part by weight |
| (e) | Crystal Violet (having a molecular weight of 408) | 0.3 part by weight |

A 10% by weight solution in n-hexane of a silicone rubber compound having a composition described below was coated on the so-prepared photosensitive resin layer and dried in hot air maintained at 50° C. to form a silicone rubber layer having a thickness of 2 microns.

| | | |
|---|---|---|
| (a) | Polydimethylsiloxane (containing OH groups on both the molecule terminals and having a molecular weight of 80,000) | 100 parts by weight |
| (b) | Methyltriacetoxysilane | 5 parts by weight |
| (c) | Dibutyl tin diacetate | 0.2 part by weight |

A polyethylene terephthalate film having a thickness of 10 microns ("Lumirror" [trademark] manufactured and supplied by Toray Ind. Inc.) was laminated on the so-prepared silicone rubber layer to obtain a printing plate.

After 1 day had passed from the preparation of the printing plate, a positive film was superposed on the printing plate and caused to adhere closely to the printing plate under reduced pressure. Then, the assembly was exposed for 120 seconds to rays of 2-KW super-high-pressure mercury lamp (manufactured and supplied by OHC Mfg. Co. Ltd.) located 1 m from the printing plate. After the cover film had been removed, the surface of the printing plate was lightly rubbed with a cotton pad impregnated with n-hexane to remove the silicone rubber layer in the non-exposed area and obtain an printing plate. The adaptability of the so-prepared printing plate to direct printing was very good and similar to that prepared in Example 1. However, when a so-prepared printing plate was stored at room temperature for 1 month or at 50° C. for 7 days before light exposure, drastic reduction of the sensitivity took place and an image could not be formed on the printing plate by the above-mentioned treatment.

EXAMPLE 3

A chloroprene layer having a thickness of 0.3 mm and a rubber hardness of 60 (Shore A) was formed on an aluminum sheet having a thickness of 0.3 mm, and a polyester film having a thickness of 3 microns ("Lumirror" [trademark]manufactured and supplied by Toray Ind. Inc.) was laminated on the chloroprene layer to form a composite substrate. A 10% by weight solution of a solid composition described below in a 1/1 mixed solvent of n-butyl acetate/ethyl cellosolve acetate was coated on the composite substrate and dried in hot air maintained at 80° C. to form a photosensitive resin layer having a thickness of 3 microns.

| (a) 60/30/10 Weight ratio copolymer of ethyl acrylate/methyl methacrylate/acrylic acid | 50 parts by weight |
|---|---|
| (b) Reaction product of 4 mols of glycidyl methacrylate with 1 mol of xylylene diamine | 48 parts by weight |
| (c) Michler's ketone | 2 parts by weight |
| (d) Crystal Violet | 0.2 part by weight |

Then, a 10% by weight solution of the same silicone gum compound as used in Example 1 in n-hexane was coated on the so-prepared photosensitive resin layer and dried in hot air maintained at 50° C. to form a silicone rubber layer having a thickness of 2 microns.

A polyethylene terephthalate film having a thickness of 10 microns (Lumirror) was laminated on the silicone rubber layer to obtain a printing plate.

A positive film was superposed on the printing plate and the assembly was exposed for 120 seconds to rays of 2-KW super-high-pressure mercury lamp (manufactured and supplied by OHC Mfg. Co. Ltd.) located 1 m from the printing plate. The cover film was removed, and the surface of the printing plate was lightly rubbed with a cotton pad impregnated with n-hexane to remove the silicone rubber layer in the non-exposed area and obtained a printing plate. The photosensitive characteristics of such a printing plate before exposure were changed only to a negligible extent even after storage at room temperature for month or at 50° C. for 7 days.

The printing plate was attached to an ordinary flat bed letterpress printing machine, and direct printing was conducted on coated paper by using a waterless planographic ink ("ALPO-G" [trademark]manufactured and supplied by Toka Shikiso Kagaku Kogyo). The ink was transferred onto the entire paper in a very good state and prints having a sharp image were obtained.

COMPARATIVE EXAMPLE 3

A printing plate was prepared in the same manner as described in Example 3 except that a composite substrate consisting of the aluminum sheet and the rubber layer was used and the photosensitive resin layer and silicone rubber layer were directly formed on the rubber layer.

When a so-prepared printing plate was allowed to stand for 1 day, the exposure, developing and printing characteristics of the printing plate were substantially the same as those of the printing plate prepared in Example 3, but when a printing plate was stored at room temperature for 1 month or at 50° C. for 7 days, drastic reduction of the sensitivity took place and no image could be formed by the plate-making process.

EXAMPLE 4

A nitrile rubber layer having a thickness of 0.3 mm and a rubber hardness of 80 (Shore A) was formed on an aluminum sheet having a thickness of 0.24 mm, and a polypropylene film having a thickness of 5 microns ("Torayfan" [trademark]manufactured and supplied by Toray Ind. Inc.) was laminated on the nitrile rubber layer to form a composite substrate. A 3% by weight solution having a solid composition described below in toluene was coated on the composite substrate to form an adhesive layer having a thickness of 1 micron.

| (a) Vylon 300 (trademark, manufactured and supplied by Toyobo Co.) | 80 parts by weight |
|---|---|
| (b) CORONATE 3015 (trademark, manufactured and supplied by Nippon Polyurethane Co.) | 20 parts by weight |

Then, a 10% by weight solution of a photosensitive resin composition described below in ethyl cellosolve was coated on the adhesive layer and dried in hot air maintained at 80° C. to form a photosensitive resin layer having a thickness of 4 microns.

| (a) Polyurethane ("Pandex T 5205" [trademark] manufactured and supplied by Dainippon Ink Kagaku Kogyo) | 60 parts by weight |
|---|---|
| (b) Reaction product of 4 mols of glycidyl methacrylate with 1 mol of xylylene diamine | 25 parts by weight |
| (c) Triethylene glycol diacrylate | 10 parts by weight |
| (d) Michler's Ketone | 4 parts by weight |
| (e) Maleic acid | 0.5 part by weight |
| (f) Crystal Violet | 0.4 part by weight |

A silicone gum (RTV type) dispersion ("YE 3085" [trademark]manufactured and supplied by Toshiba Silicone Co.) was diluted with n-heptane to form a 10% by weight solution, and the solution was coated on the photosensitive resin layer and was dried in hot air maintained at 50° C. to form a silicone rubber layer having a thickness of 5 microns. Then, a polypropylene film having a thickness of 9 microns (Torayfan) was laminated on the silicone rubber layer to obtain a printing plate.

A printing plate was prepared by carrying out exposure and development in the same manner as described in Example 3.

The exposure characteristic and storage stability of the printing plate before the plate-making process were as good as those of the printing plate prepared in Example 3.

The printing plate was attached to a direct printing machine of the type performing printing by rotation of a cylinder having the printing plate attached thereto, and the test of printing on an aluminum sheet was carried out. Good printing test results were obtained.

EXAMPLE 5

A polyester elastomer having properties described below was obtained by polymerizing 149.4 parts of terephthalic acid, 16.6 parts of isophthalic acid and 381 parts of polytetramethylene glycol having a number average molecular weight of 1,000 in the presence of titanium tetrabutoxide as a catalyst.

Melting point: 138° C.
Glass transition temperature: −65° C.
Strength at break: 200 Kg/cm$^2$
Elongation at break: 850%
Elastic modulus in tension: 140 Kg/cm$^2$
Resilience elastic modulus: 78%
Shore hardness (Shore D): 30

This elastomer comprised 75% of the PTMG component, 22.5% of the PBT component and 2.5% of the PBI component.

The elastomer was formed into a sheet having a thickness of 0.3 mm by using an extrusion molding machine. A phenolic resin-modified chloroprene adhesive was coated on an aluminum sheet having a thickness of 0.3 mm, and the above-mentioned elastomer sheet was laminated on the adhesive-applied aluminum sheet to obtain a composite support.

In the same manner as described in Example 1, the photosensitive layer and silicone rubber layer were formed on the so-prepared composite support to obtain a printing plate.

The direct printing test was carried out on this printing plate in the same manner as described in Example 1. Good results were similarly obtained.

We claim:

1. A direct printing plate requiring no dampening water, comprising, in the order mentioned, a rubber support layer having a Shore A hardness of not more than 90 or a Shore D hardness of not more than 40 and a thickness of 0.01 to 1 mm, a quinone-diazide photosensitive resin layer coated on said support layer and having a thickness of 0.5 to 30 microns, a silicone rubber outer layer coated on said photosensitive resin layer and having at thickness of 1 to 100 microns, whereby upon development corresponding portions of both said silicone rubber outer layer and the photosensitive resin layer are removed to form ink receiving cavities said cavities having a depth of 1.5-130 microns and being able to retain more ink than is retained by flat or convex ink-receiving areas formed on the silicone rubber layer, or by concave ink-receiving cavities formed in the silicone rubber layer alone, whereby the printing plate in direct printing accepts and transfers a relatively large amount of ink without requiring water dampening.

2. A planographic printing plate according to claim 1, wherein said photosensitive resin layer comprises as a photosensitive resin ingredient a photosensitive high polymeric substance having a molecular weight of at least 1,000.

3. A planographic printing plate according to claim 1, wherein said printing plate further comprises a barrier layer between said rubber support layer and said photosensitive resin layer, said barrier layer being composed of a film of a synthetic resin having at thickness of 0.5 to 30 microns, said barrier layer being effective to prevent migration of low molecular weight monomers from the photosensitive resin layer into the rubber layer.

* * * * *

UNITED STATES PATENT AND TRADEMARK OFFICE
CERTIFICATE OF CORRECTION

PATENT NO. : 5,053,311
DATED : October 1, 1991
INVENTOR(S) : Fumikatsu Makino et al It is certified that error appears in the above-identified patent and that said Letters Patent is hereby corrected as shown below:

On the title page, before item (21), insert the following Section [73]
--[73] Assignee: Toray Industries, Inc.--.

Column 3, line 18, "β(4-azidophenol)tthanol" should be changed to --β(4-azidophenol)ethanol--.

Column 6, line 53, "superpose don" should be changed to --superposed on--.

Column 9, line 33, "for one month" to read -- for 1 month --. one month--.

Signed and Sealed this

Fourth Day of May, 1993

Attest:

MICHAEL K. KIRK

*Attesting Officer*   *Acting Commissioner of Patents and Trademarks*